United States Patent
Wang et al.

(10) Patent No.: US 7,811,858 B2
(45) Date of Patent: Oct. 12, 2010

(54) PACKAGE AND THE METHOD FOR MAKING THE SAME, AND A STACKED PACKAGE

(75) Inventors: Meng-Jen Wang, Kaohsiung (TW); Wei-Chung Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 42 days.

(21) Appl. No.: 12/185,879

(22) Filed: Aug. 5, 2008

(65) Prior Publication Data
US 2009/0039526 A1    Feb. 12, 2009

(30) Foreign Application Priority Data
Aug. 7, 2007    (TW) ............................... 96129098 A

(51) Int. Cl.
*H01L 21/48* (2006.01)
*H01L 21/50* (2006.01)

(52) U.S. Cl. ...................................... 438/113; 438/127

(58) Field of Classification Search ........................ None
See application file for complete search history.

(56) References Cited

U.S. PATENT DOCUMENTS

| | | | | |
|---|---|---|---|---|
| 5,352,629 | A * | 10/1994 | Paik et al. ................. | 228/123.1 |
| 5,478,778 | A * | 12/1995 | Tanisawa ..................... | 438/25 |
| 6,084,308 | A * | 7/2000 | Kelkar et al. ................. | 257/777 |
| 6,271,469 | B1 * | 8/2001 | Ma et al. ..................... | 174/521 |
| 7,160,755 | B2 * | 1/2007 | Lo et al. ..................... | 438/106 |
| 2006/0046352 | A1 * | 3/2006 | Low et al. .................... | 438/127 |
| 2007/0015315 | A1 * | 1/2007 | Shiraishi et al. ............. | 438/113 |
| 2008/0023435 | A1 * | 1/2008 | Wu et al. ....................... | 216/2 |

* cited by examiner

*Primary Examiner*—Scott B Geyer
(74) *Attorney, Agent, or Firm*—Volentine & Whitt, P.L.L.C.

(57) ABSTRACT

A package and the method for making the same, and a stacked package, the method for making the package includes the following steps: (a) providing a carrier having a plurality of platforms; (b) providing a plurality of dice, and disposing the dice on the platforms; (c) performing a reflow process so that the dice are self-aligned on the platforms; (d) forming a molding compound in the gaps between the dice, and (e) performing a cutting process so as to form a plurality of packages. Since the dice are self-aligned on the platforms during the reflow process, a die attach machine with low accuracy can achieve highly accurate placement.

11 Claims, 10 Drawing Sheets

PACKAGE AND THE METHOD FOR MAKING THE SAME, AND A STACKED PACKAGE

BACKGROUND OF THE INVENTION

1. Field of the Invention

The present invention relates to a package and the method for making the same, and more particularly to a package and the method for making the same, and a stacked package.

2. Description of the Related Art

In a conventional method for making a stacked package, a plurality of die elements are formed on a wafer first, then two or more than two wafers are stacked, and a cutting process is performed so as to form a plurality of stacked package. The conventional method has a disadvantage, which is that the die elements on the wafer are not tested. Therefore, the stacked packages formed as described above have the problem of high defective fraction. Especially, if more wafers are stacked, more defective fraction will occur.

In order to eliminate the above-mentioned disadvantage, another conventional method is provided. First, the die elements on the wafer are cut off, and then stacked after being tested. The method's disadvantage is that it is hard to align the die elements during the stacking process, which results in a shift between the corresponding upper and lower die elements.

Therefore, it is necessary to provide a package and the method for making the same, and a stacked package to solve the above problems.

SUMMARY OF THE INVENTION

The present invention is directed to a method for making a package. The method comprises the following steps: (a) providing a carrier having a plurality of platforms; (b) providing a plurality of dice, and disposing the dice on the platforms; (c) performing a reflow process so that the dice are self-aligned on the platforms; (d) forming a molding compound in the gaps between the dice; and (e) performing a cutting process so as to form a plurality of packages. Since the dice are self-aligned during the reflow process, a die attach machine with high accuracy is unnecessary. That is, a die attach machine with low accuracy can achieve highly accurate placement, so the cost of the die attach machine is reduced.

DETAILED DESCRIPTION OF THE INVENTION

Figure 1:
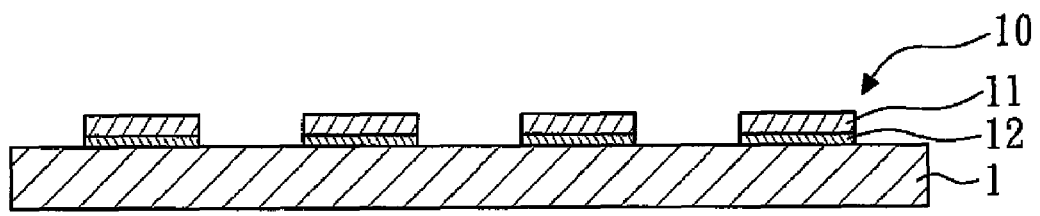
FIGS. 1 to 10 are schematic views of a method for making a package according to the present invention.

FIGS. 1 to 10 show the schematic views of the method for making the package according to the present invention. First, as shown in FIG. 1, a carrier 1 is provided. The carrier 1 has a plurality of platforms 10. In the embodiment, the carrier 1 is a silicon wafer, and each of the platforms 10 comprises a solder layer 11 and a pad 12. The pad 12 is disposed between the solder layer 11 and the carrier 1, and the material of the pad 12 is preferably metal.

Figure 2:
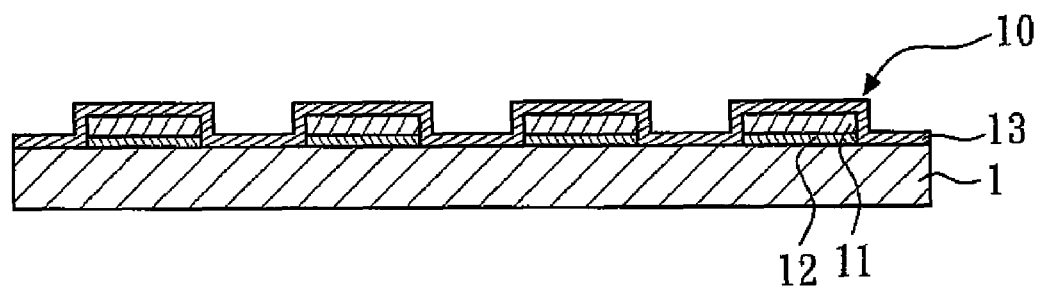

As shown in FIG. 2, a flux 13 is formed on the platforms 10 and the carrier 1.

Figure 3:
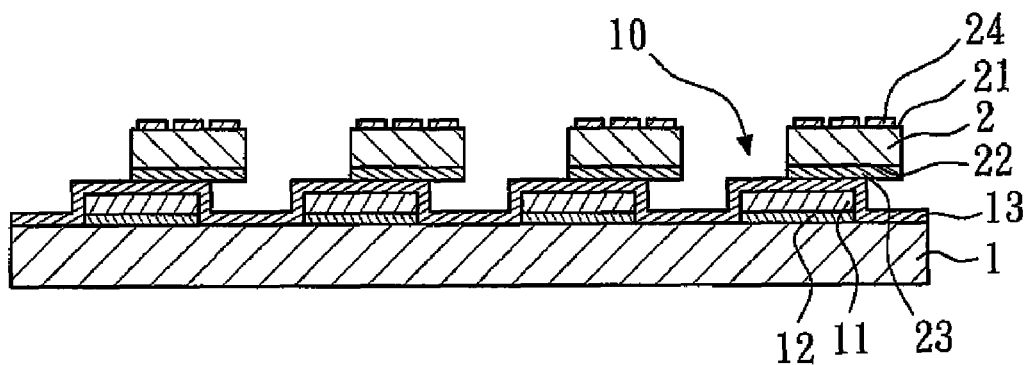

As shown in FIG. 3, a plurality of dice 2 are provided, and disposed on the platforms 10, that is, on the flux 13. In the embodiment, the dice 2 are tested and are known good dice. Each of the dice 2 comprises a first surface 21 and a second surface 22. The second surface 22 faces the platforms 10, and the second surface 22 further comprises a wettable layer 23. The first surface 21 further comprises a plurality of ball pads 24.

Figure 4:
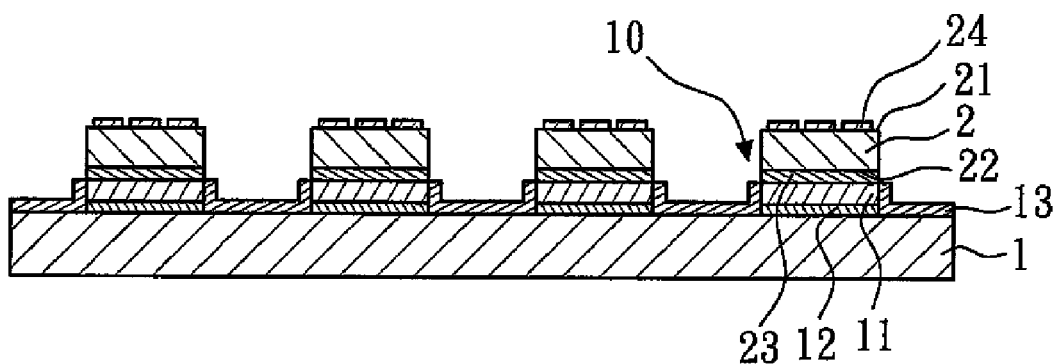

As shown in FIG. 4, a reflow process is performed so that the dice 2 are self-aligned on the platforms 10. This is because that the solder layer 11 has surface tension during the reflow process, which makes the dice 2 on the solder layer 11 able to self-align.

Figure 5:
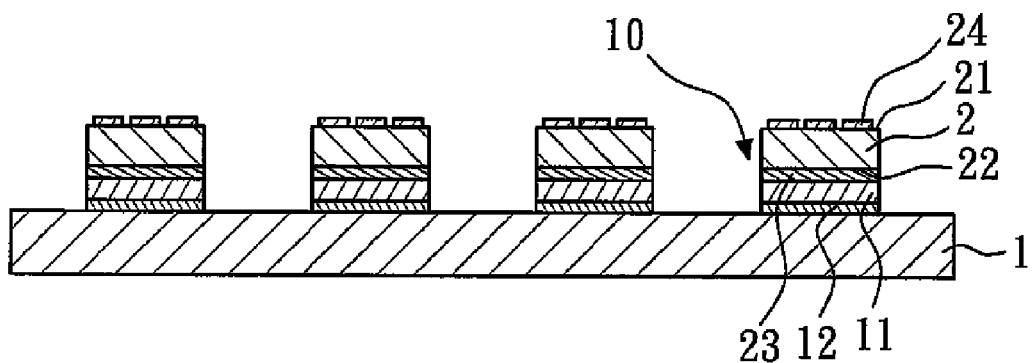
Figure 6:
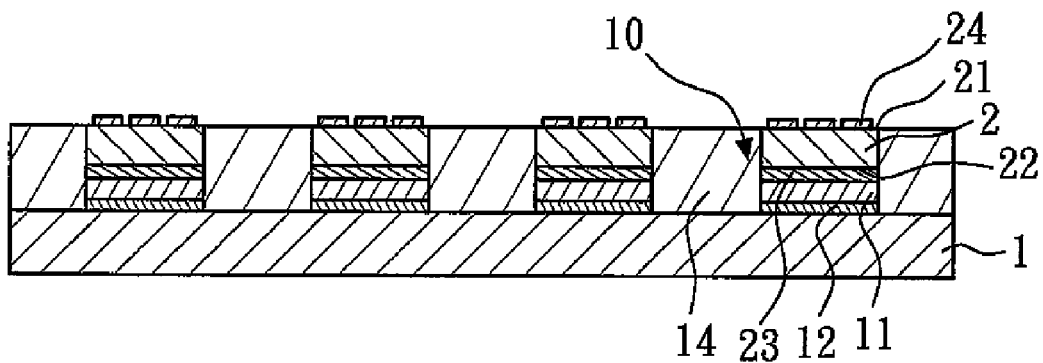
Figure 7:
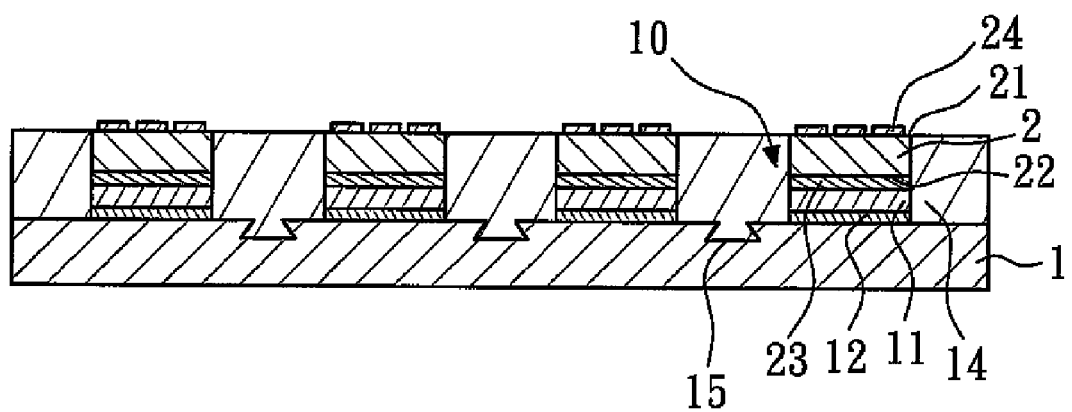

As shown in FIG. 5, the flux 13 is removed. Afterward, as shown in FIG. 6, a molding compound 14 is formed in the gaps between the dice 2, and the ball pads 24 are exposed. Preferably, in another embodiment, the carrier 1 further has a plurality of grooves 15 disposed between the platforms 10. The grooves 15 are filled with the molding compound 14 so as to increase the combination between the molding compound 14 and the carrier 1, as shown in FIG. 7.

Figure 8:
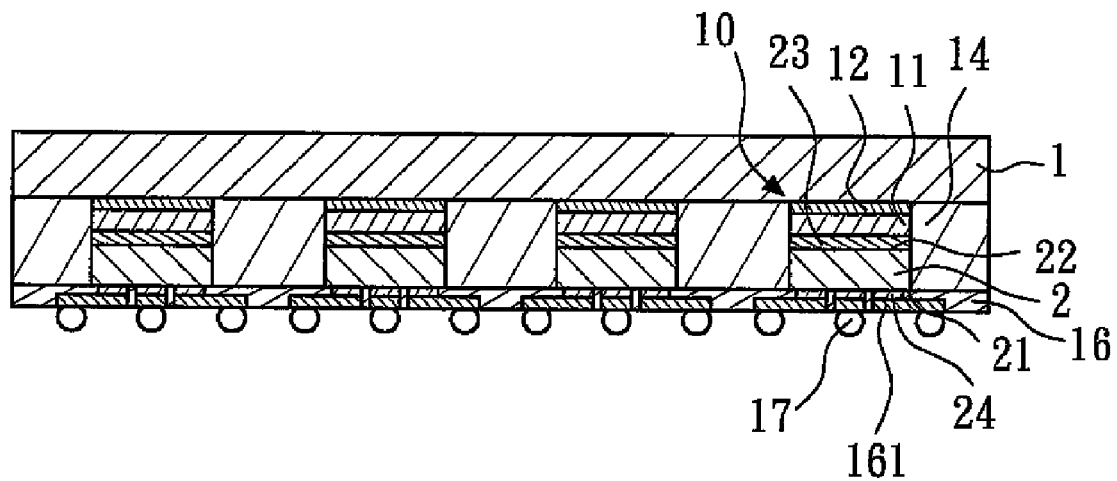

As shown in FIG. 8, a circuit layer 16 is formed on the molding compound 14, and the circuit layer 16 electrically connects the dice 2. In the embodiment, the circuit layer 16 comprises a redistribution layer 161, and the redistribution layer 161 connects the ball pads 24. Preferably, a plurality of solder balls 17 are further formed on the circuit layer 16. The solder balls 17 connect the redistribution layer 161, and further electrically connect the ball pads 24.

Figure 9:
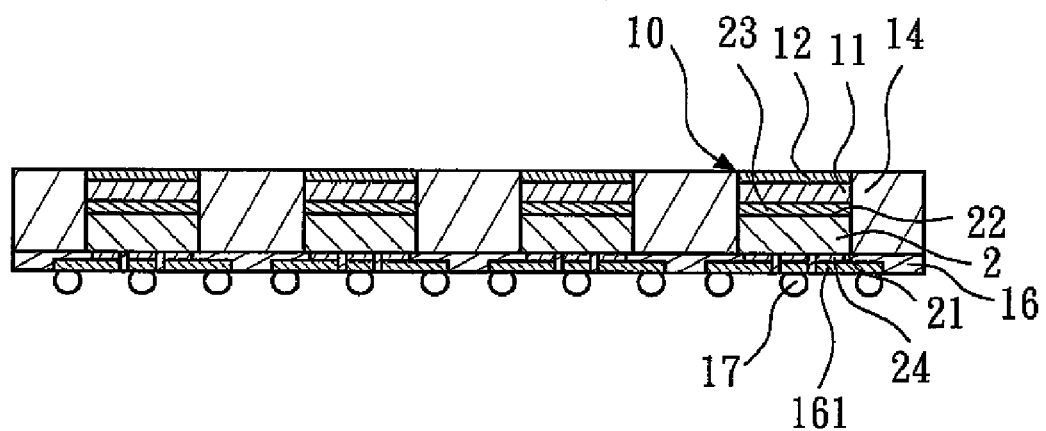

In FIG. 9, the carrier 1 is removed. Finally, in FIG. 10, a cutting process is performed so as to form a plurality of package 3. It should be noted that the cutting process may be performed without removing the carrier 1, so the packages 3 may include the carrier 1.

In the embodiment, the pads 12 are formed on the carrier 1 by a photo-lithography process, and the solder layer 11 is formed on the pads 12 by electroplating, so that highly accurate placement can be achieved. Moreover, the dice 4 can be self-aligned during the reflow process, so a die attach machine with high accuracy is unnecessary. That is, in the embodiment, a die attach machine with low accuracy can achieve highly accurate placement, so the cost of the die attach machine is reduced.

Figure 10:
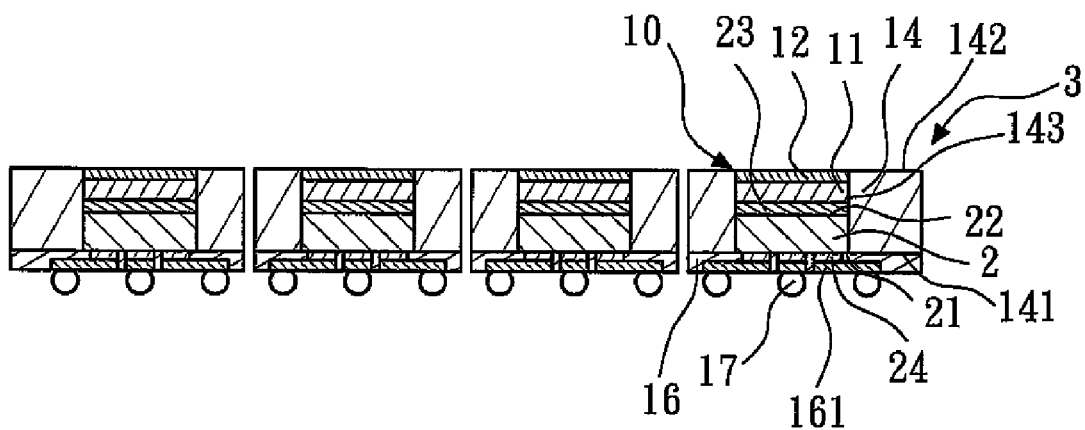

FIG. 10 shows the schematic view of a package of the present invention. The package 3 comprises a molding compound 14, a platform 10, a die 2, a wettable layer 23 and a circuit layer 16.

The molding compound 14 has a first surface 141, a second surface 142 and an accommodating groove 143. The accommodating groove 143 penetrates the molding compound 14. The platform 10 is disposed in the accommodating groove 143 and exposed to the second surface 142 of the molding compound 14. In the embodiment, the platform 10 comprises a solder layer 11 and a pad 12. The solder layer 11 is disposed between the pad 12 and the wettable layer 23. The material of the pad 12 is metal.

The die 2 is disposed in the accommodating groove 143, and has a first surface 21 and a second surface 22. The first surface 21 of the die 2 is exposed to the first surface 141 of the molding compound 14. Preferably, the first surface 21 of the die 2 further comprises a plurality of ball pads 24.

The wettable layer 23 is disposed on the second surface 22 of the die 2, and connects the solder layer 11 of the platform 10. The circuit layer 16 is disposed on the first surface 141 of the molding compound 14, and the circuit layer 16 electrically connects the first surface 21 of the die 2. In the embodiment, the circuit layer 16 comprises a redistribution layer 161, and the redistribution layer 161 connects the ball pads 24. Preferably, the circuit layer 16 further comprises a plurality of solder balls 17. The solder balls 17 connect the redistribution layer 161, and further electrically connect the ball pads 24. In another embodiment, the package 3 further comprises a carrier (not shown) disposed on the second surface 142 of the molding compound 14.

Figure 11:
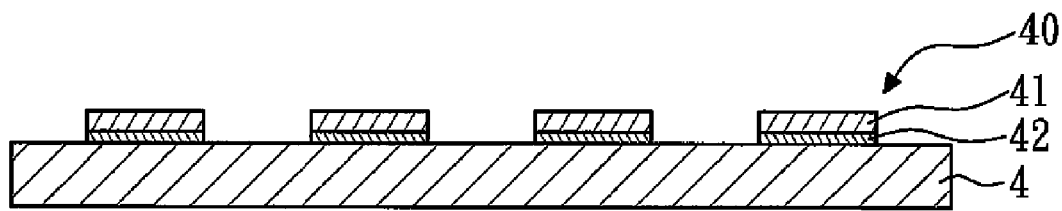
FIGS. 11 to 23 are schematic views of a method for making a stacked package according to the present invention.

FIGS. 11 to 23 show the schematic views of the method for making the stacked package according to the present invention. First, as shown in FIG. 11, a first carrier 4 is provided. The first carrier 4 has a plurality of first platforms 40. In the embodiment, the first carrier 4 is a silicon wafer, and each of the first platforms 40 comprises a first solder layer 41 and a first pad 42. The first pads 42 is disposed between the first solder layer 41 and the first carrier 4.

Figure 12:
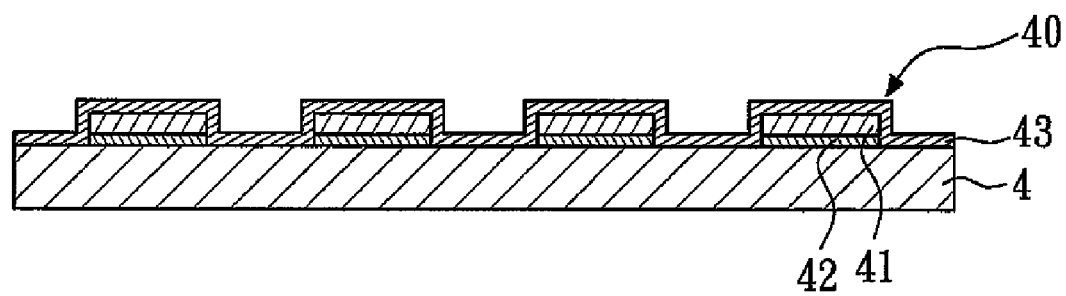

As shown in FIG. 12, a first flux 43 is formed on the first platforms 40 and the first carrier 4.

Figure 13:
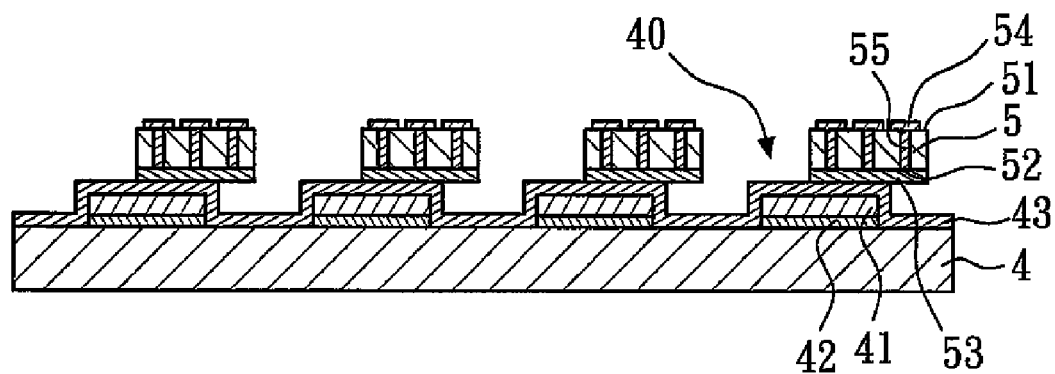

As shown in FIG. 13, a plurality of first dice 5 are provided. The first dice 5 are disposed on the first platform 40, that is, on the first flux 43. In the embodiment, the first dice 5 are tested and are known good dice. Each of the first dice 5 comprises a first surface 51, a second surface 52 and at least one first via 55. The second surface 52 faces the first platform 40, and the second surface 52 further comprises a first wettable layer 53. The first surface 51 further comprises a plurality of first ball pads 54. The first vias 55 comprises a conductive metal therein, and the material of the conductive metal may be the same as or different from that of the first wettable layer 53.

Figure 14:
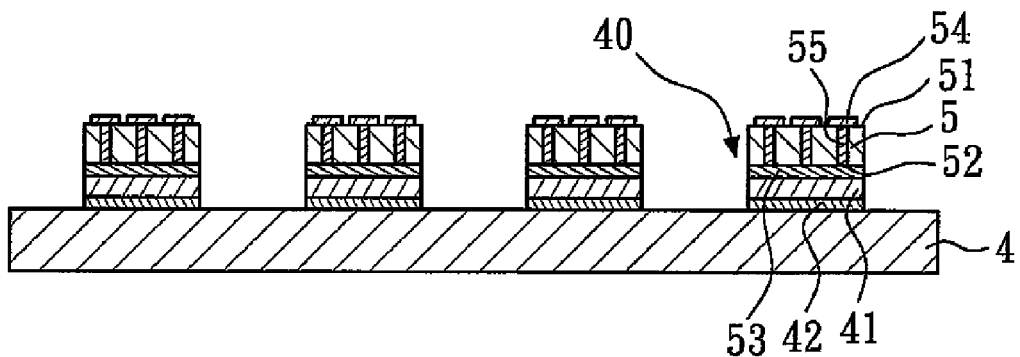

As shown in FIG. 14, a reflow process is performed so that the first dice 5 are self-aligned on the first platforms 40. Afterward, the first flux 43 is removed.

Figure 15:
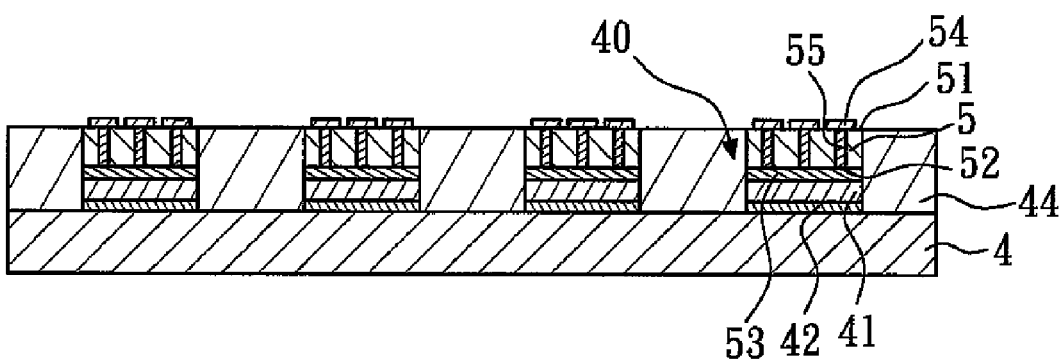

As shown in FIG. 15, a first molding compound 44 is formed in the gaps between the first dice 5, and the first ball pads 54 are exposed.

Figure 16:
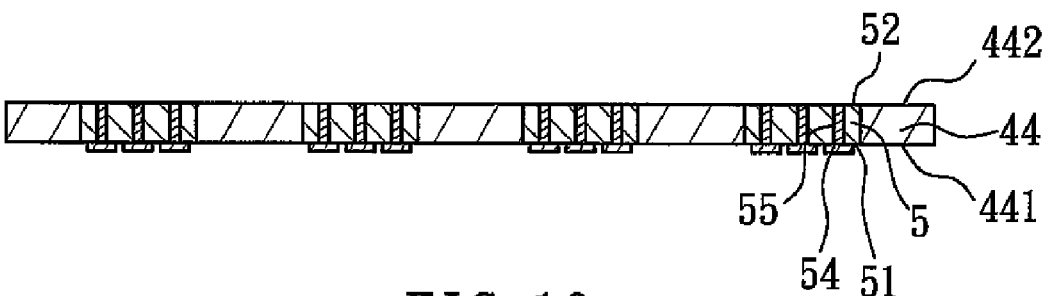

As shown in FIG. 16, the first carrier 4, part of the first molding compound 44, the first solder layer 41, the first pad 42 and the first wettable layer 53 are removed so as to expose the first via 55, and the first molding compound 44 has a first surface 441 and a second surface 442.

Figure 17:
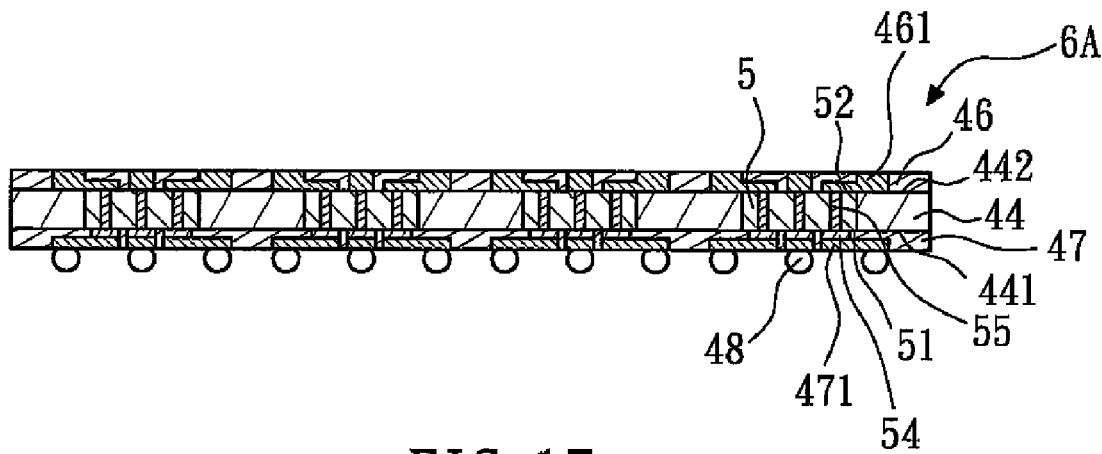

As shown in FIG. 17, a first upper circuit layer 46 and a first lower circuit layer 47 are formed on the second surface 442 and the first surface 441 of the first molding compound 44 respectively. The first upper circuit layer 46 is electrically connected to the first lower circuit layer 47 by the first vias 55 and the first ball pads 54, so as to form a first package element 6A. In the embodiment, the first upper circuit layer 46 comprises a first upper redistribution layer 461, and the first lower circuit layer 47 comprises a first lower redistribution layer 471. Preferably, a plurality of first solder balls 48 are further formed on the first lower circuit layer 47, and connect the first lower redistribution layer 471.

Afterward, a second package element is provided. The second package element may be a package of any type. In the embodiment, the second package element is substantially the same as the first package element 6A, and the method for making the second package is described as below.

Figure 18:
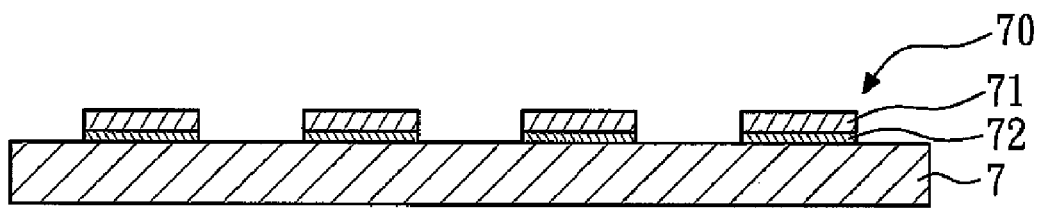

First, as shown in FIG. 18, a second carrier 7 is provided. The second carrier 7 has a plurality of second platforms 70. In the embodiment, the second carrier 7 is a silicon wafer, and each of the second platforms 70 comprises a second solder layer 71 and a second pad 72. The second pad 72 is disposed between the second solder layer 71 and the second carrier 7.

Afterward, a second flux (not shown) is formed on the second platforms 70 and the second carrier 7.

Figure 19:
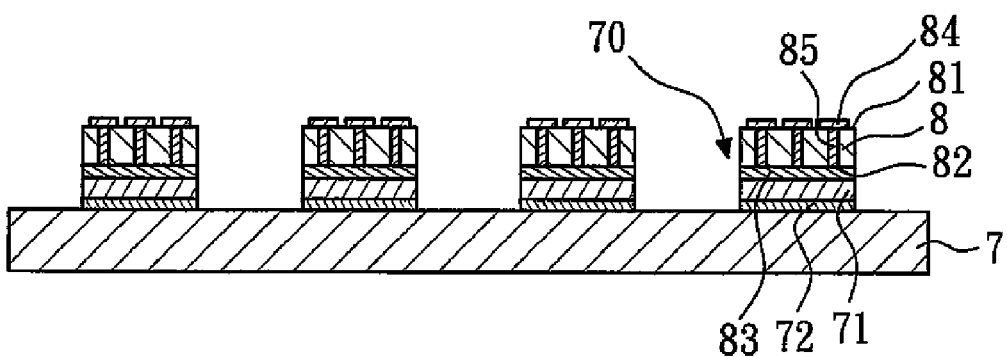

As shown in FIG. 19, a plurality of second dice 8 are provided, and disposed on the second platforms 70, that is, on the second flux. The function or size of the second dice 8 may be the same as or different from that of the first dice 5. In the embodiment, the second dice 8 are tested and are known good dice. Each of the second dice 8 comprises a first surface 81, a second surface 82 and at least one second via 85. The second surface 82 faces the second platforms 70, and the second surface 82 further comprises a second wettable layer 83. The first surface 81 further comprises a plurality of second ball pads 84. The second via 85 comprises a conductive metal, and the material of the conductive metal may be the same as or different from that of the second wettable layer 83. Afterward, a reflow process is performed so that the second dice 8 are self-aligned on the second platforms 70. Afterward, the second flux is removed.

Figure 20:
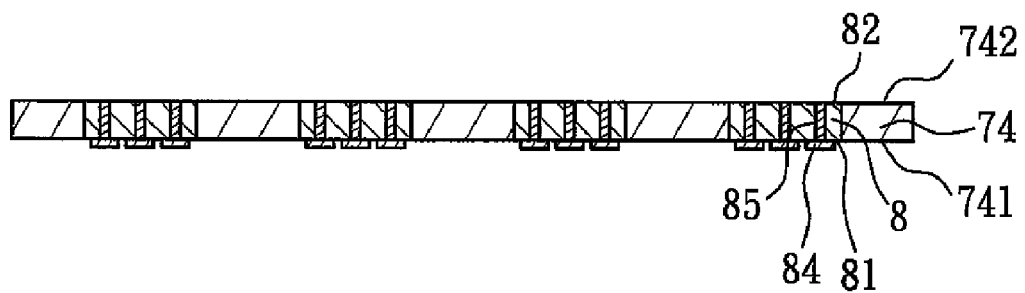

As shown in FIG. 20, a second molding compound 74 is formed in the gaps between the second dice 8, and the second ball pads 84 are exposed. Afterward, the second carrier 7, part of the second molding compound 74, the second solder layer 71, the second pad 72 and the second wettable 83 are removed so as to expose the second via 85, and the second molding compound 74 has a first surface 741 and a second surface 742.

Figure 21:
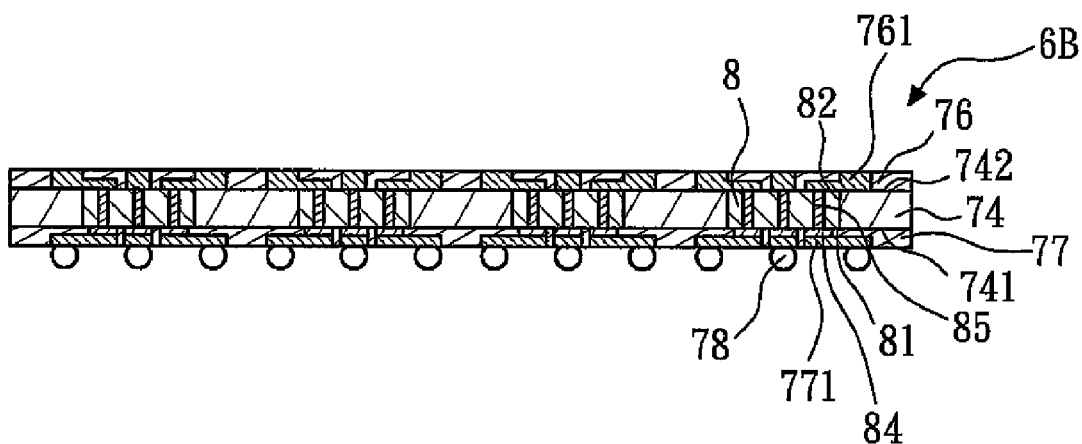

As shown in FIG. 21, a second upper circuit layer 76 and a second lower circuit layer 77 are formed on the second surface 742 and the first surface 741 of the second molding compound 74 respectively. The second upper circuit layer 76 is electrically connected to the second lower circuit layer 77 by the second vias 85 and the second ball pads 84 so as to form a second package element 6B. In the embodiment, the second upper circuit layer 76 comprises a second upper redistribution layer 761, the second lower circuit layer 77 comprises a second lower redistribution 771. Preferably, a plurality of second solder balls 78 are further formed on the second lower circuit layer 77, and connect the second lower redistribution 771.

Figure 22:
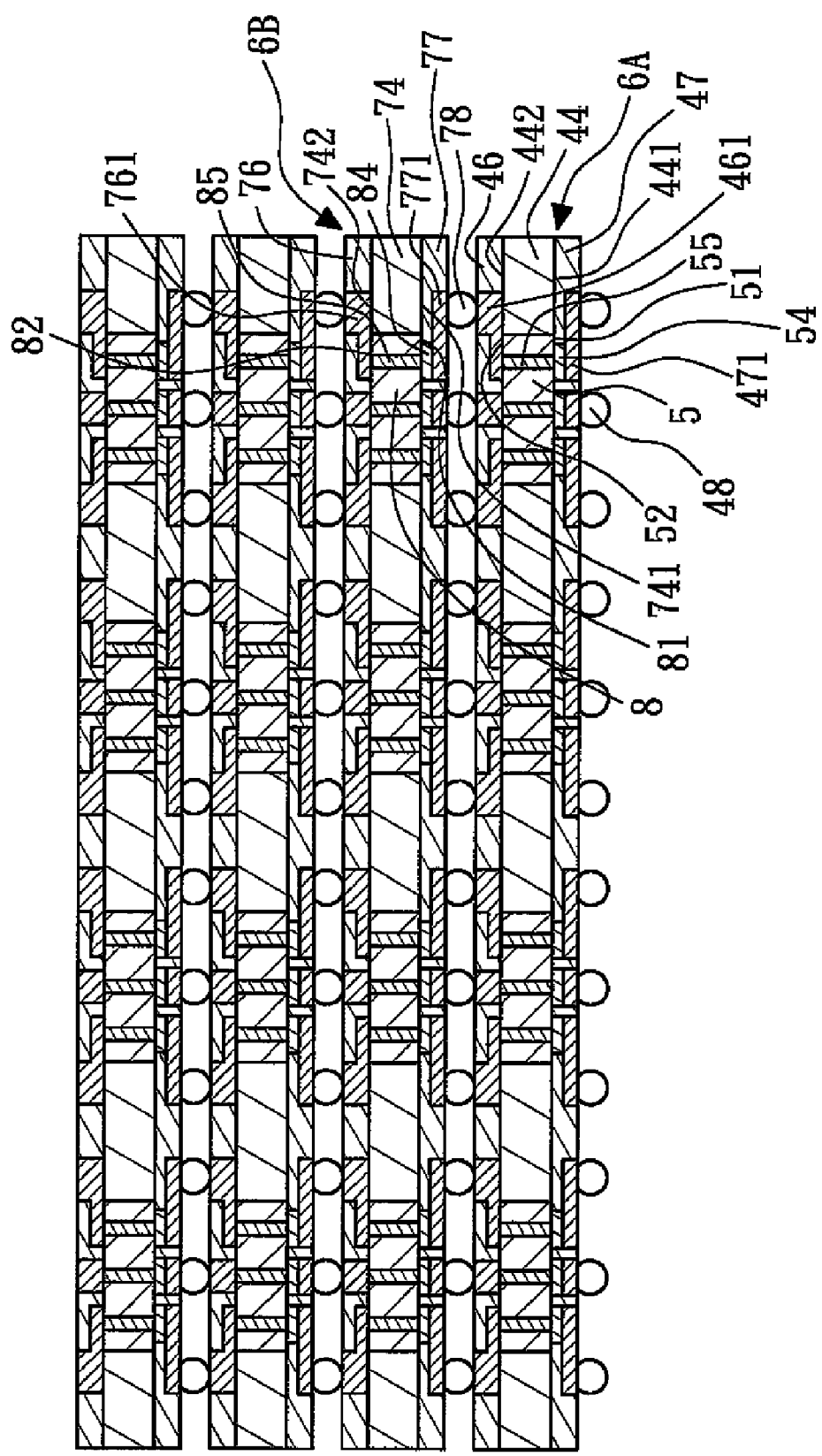

As shown in FIG. 22, the first package element 6A and the second package element 6B are stacked. It is understood that other package element may be further stacked on the second package element 6B. Afterward, as shown in FIG. 23, a cutting process is performed so as to form a plurality of stacked package 9.

Figure 23:
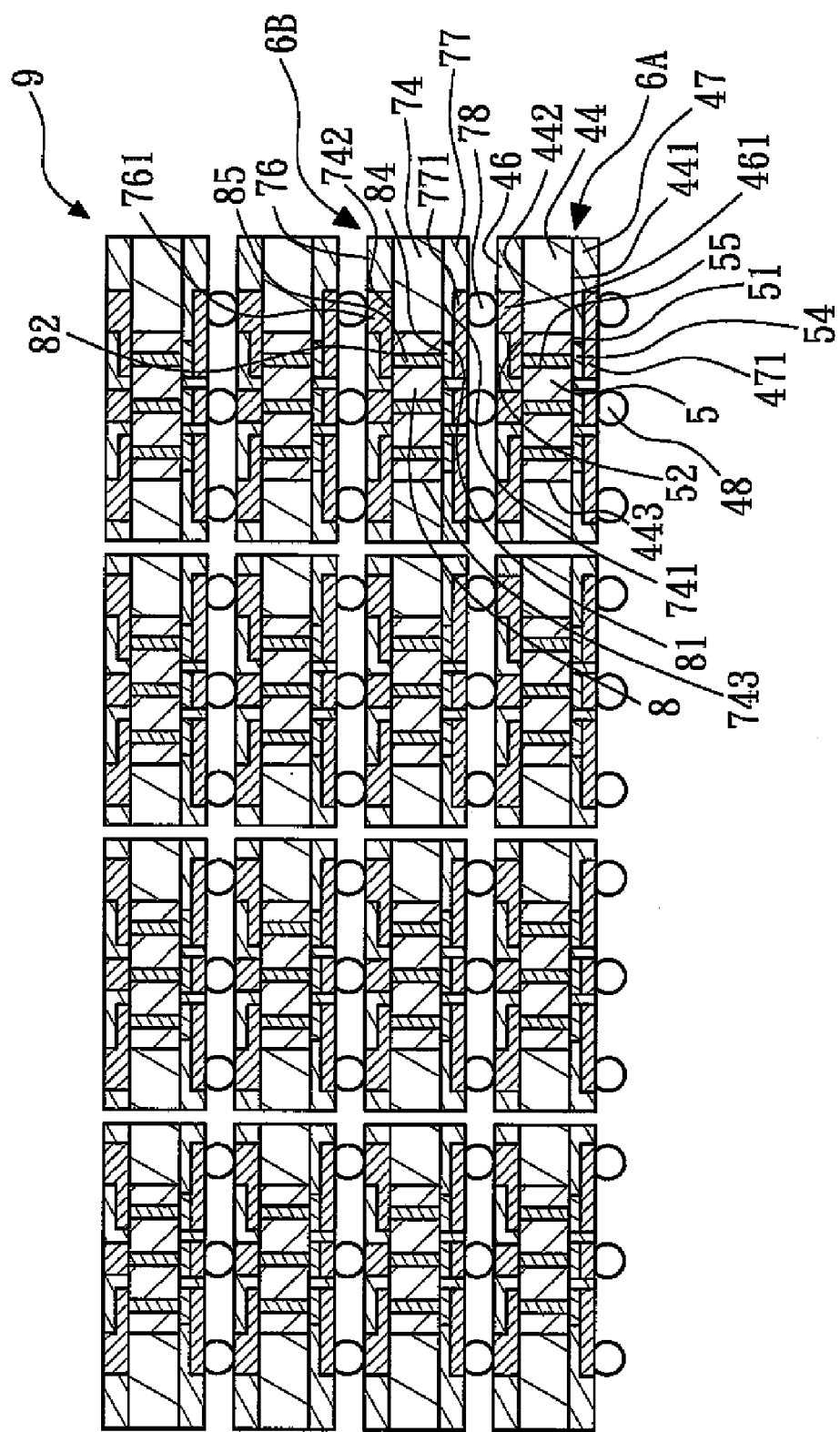

FIG. 23 shows the schematic view of the stacked package of the present invention. The stacked package 9 comprises a first package element 6A and a second package element 6B.

The first package element 6A comprises a first molding compound 44, a first die 5, a first upper circuit layer 46 and a first lower circuit layer 47.

The first molding compound 44 has a first surface 441, a second surface 442 and a first accommodating groove 443. The first accommodating groove 443 penetrates the first molding compound 44. The first die 5 is disposed in the first accommodating groove 443, and has a first surface 51, a second surface 52 and at least one first via 55. The first surface 51 of the first die 5 is exposed to the first surface 441 of the first molding compound 44, and the second surface 52 of the first die 5 is exposed to the second surface 442 of the first molding compound 44. Preferably, the first surface 51 of the first die 5 further comprises a plurality of first ball pads 54.

The first upper circuit layer 46 is disposed on the second surface 442 of the first molding compound 44. The first lower circuit layer 47 is disposed on the first surface 441 of the first molding compound 44. The first upper circuit layer 46 is electrically connected to the first lower circuit layer 47 by the first via 55. Preferably, the first lower circuit layer 47 further comprises a plurality of first solder balls 48.

The second package element 6B is stacked on the first package element 6A, and electrically connected to the first upper circuit layer 46.

The second package element 6B comprises a second molding compound 74, a second die 8, a second upper circuit layer 76 and a second lower circuit layer 77.

The second molding compound 74 has a first surface 741, a second surface 742 and a second accommodating groove 743. The second accommodating groove 743 penetrates the second molding compound 74. The function or size of the second die 8 may be the same as or different from that of the first die 5. The second die 8 is disposed in the second accommodating 743, and has a first surface 81, a second surface 82 and at least one second via 85. The first surface 81 of the second die 8 is exposed to the first surface 841 of the second molding compound 84, and the second surface 82 of the second die 8 is exposed to the second surface 842 of the second molding compound 84. Preferably, the first surface 81 of the second die 8 further comprises a plurality of second ball pads 84.

The first upper circuit layer 46 is disposed on the second surface 442 of the first molding compound 44. The first lower circuit layer 47 is disposed on the first surface 441 of the first molding compound 44. The first upper circuit layer 46 is electrically connected to the first lower circuit layer 47 by the first via 55. Preferably, the second lower circuit layer 77 further comprises a plurality of second solder balls 78. The second lower circuit layer 77 is electrically connected to the first upper circuit layer 46 by the second solder balls 78.

In the embodiment, the dice are tested and are known good dice, and stacked with highly accurate placement, so the yield rate is raised. Moreover, dice with different sizes can be stacked in the embodiment, so the flexibility of layout is increased.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A method for making a package, comprising:
    (a) providing a carrier having a plurality of platforms, wherein each of the platforms comprises a solder layer and a pad, and the pad is disposed between the solder layer and the carrier;
    (b) providing a plurality of dice, and disposing the dice on the platforms;
    (c) performing a reflow process so that the dice are self-aligned on the platforms;
    (d) forming a molding compound in the gaps between the dice; and
    (e) performing a cutting process so as to form a plurality of packages.

2. The method as claimed in claim 1, further comprising a step of forming a flux on the platforms after Step (a), and removing the flux after Step (c).

3. The method as claimed in claim 1, wherein each of the dice comprises a first surface and a second surface, the second surface faces the platforms, and the second surface further comprises a wettable layer, and the first surface further comprises a plurality of ball pads.

4. The method as claimed in claim 1, wherein the carrier further has a plurality of grooves disposed between the platforms, and in Step (d), the molding compound is further formed in the grooves.

5. The method as claimed in claim 1, further comprising a step of forming a circuit layer on the molding compound after Step (d), wherein the circuit layer electrically connects the dice.

6. A method for making a package, comprising:
    (a) providing a carrier having a plurality of platforms, and forming a flux on the platforms;
    (b) providing a plurality of dice, and disposing the dice on the platforms;
    (c) performing a reflow process so that the dice are self-aligned on the platforms, and removing the flux;
    (d) forming a molding compound in the gaps between the dice; and
    (e) performing a cutting process so as to form a plurality of packages.

7. The method as claimed in claim 6, wherein each of the platforms comprises a solder layer and a pad, and the pad is disposed between the solder layer and the carrier.

8. The method as claimed in claim 6, wherein each of the platforms comprises a solder layer.

9. The method as claimed in claim 6, wherein each of the dice comprises a first surface and a second surface, the second surface faces the platforms, and the second surface further comprises a wettable layer, and the first surface further comprises a plurality of ball pads.

10. The method as claimed in claim 6, wherein the carrier further has a plurality of grooves disposed between the platforms, and in Step (d), the molding compound is further formed in the grooves.

11. The method as claimed in claim 6, further comprising a step of forming a circuit layer on the molding compound after Step (d), wherein the circuit layer electrically connects the dice.

* * * * *